(12) United States Patent
Niu et al.

(10) Patent No.: US 7,707,479 B2
(45) Date of Patent: Apr. 27, 2010

(54) METHOD OF GENERATING STRUCTURED IRREGULAR LOW DENSITY PARITY CHECKCODES FOR WIRELESS SYSTEMS

(75) Inventors: Huaning Niu, Santa Clara, CA (US); Chiu Ngo, San Francisco, CA (US)

(73) Assignee: Samsung Electronics Co., Ltd., Suwon (KR)

( * ) Notice: Subject to any disclaimer, the term of this patent is extended or adjusted under 35 U.S.C. 154(b) by 1024 days.

(21) Appl. No.: 11/300,211

(22) Filed: Dec. 13, 2005

(65) Prior Publication Data

US 2007/0136635 A1 Jun. 14, 2007

(51) Int. Cl.
*H03M 13/00* (2006.01)

(52) U.S. Cl. .................... 714/758; 714/801
(58) Field of Classification Search ............ 714/758, 714/801
See application file for complete search history.

(56) References Cited

U.S. PATENT DOCUMENTS

| | | | |
|---|---|---|---|
| 6,633,856 B2 * | 10/2003 | Richardson et al. ........ 706/15 |
| 6,718,508 B2 | 4/2004 | Lodge et al. |
| 6,789,227 B2 * | 9/2004 | De Souza et al. ......... 714/804 |
| 6,842,872 B2 | 1/2005 | Yedida et al. |
| 6,847,678 B2 | 1/2005 | Berezdivin et al. |
| 6,857,097 B2 | 2/2005 | Yedida et al. |
| 6,895,547 B2 * | 5/2005 | Eleftheriou et al. ....... 714/801 |
| 7,002,900 B2 | 2/2006 | Walton et al. |
| 7,055,090 B2 | 5/2006 | Kikuchi et al. |
| 7,072,289 B1 | 7/2006 | Yang et al. |
| 7,139,964 B2 | 11/2006 | Shen et al. |
| 7,165,205 B2 | 1/2007 | Blankenship et al. |
| 7,173,978 B2 | 2/2007 | Zhang et al. |
| 7,178,082 B2 | 2/2007 | Yu et al. |
| 7,213,197 B2 | 5/2007 | Jacobsen et al. |
| 7,216,283 B2 | 5/2007 | Shen et al. |
| 7,222,284 B2 | 5/2007 | Stolpman |
| 7,260,055 B2 | 8/2007 | Wang et al. |
| 7,260,763 B2 | 8/2007 | Sukhobok et al. |
| 7,283,499 B2 | 10/2007 | Priotti et al. |
| 7,324,605 B2 | 1/2008 | Maltsev et al. |
| 7,334,181 B2 | 2/2008 | Eroz et al. |
| 7,343,548 B2 | 3/2008 | Blankenship et al. |
| 7,418,051 B2 * | 8/2008 | Kramer et al. ............ 375/265 |
| 7,458,009 B2 | 11/2008 | Yu et al. |

(Continued)

OTHER PUBLICATIONS

R.G. Gallager, "Low density parity check codes", IRE Trans. Inform. Theory, Jan. 1962, vol. IT-8, pp. 21-28.

(Continued)

*Primary Examiner*—M. Mujtaba K Chaudry
(74) *Attorney, Agent, or Firm*—Kenneth L. Sherman, Esq.; Michael Zarrabian, Esq.; Myers Andras Sherman LLP

(57) ABSTRACT

A method of generating structured irregular LDPC codes for a wireless network such as a wireless local area network (WLAN) system, allowing systematic generation of improved code ensembles using density evolution, and providing essentially the best tradeoff between decoding threshold and decoding complexity. Such an LDPC code has a higher diversity order for MIMO systems, with better built-in interleaving capability. Further, the code dimension can be tailored to 802.11n system parameters such as the number of sub-carriers and delay. The code also provides an improved girth control scheme, provides flexible length with different expanding factors, and supports simple encoding and shortening for multiple rates.

20 Claims, 18 Drawing Sheets

U.S. PATENT DOCUMENTS

| | | | |
|---|---|---|---|
| 7,516,390 | B2 | 4/2009 | Shen et al. |
| 7,523,375 | B2 | 4/2009 | Spencer |
| 7,536,623 | B2 | 5/2009 | Kim |
| 7,543,197 | B2 | 6/2009 | Palanki et al. |
| 7,549,105 | B2 | 6/2009 | Shen et al. |
| 7,584,406 | B2 | 9/2009 | Niu et al. |
| 2002/0042899 | A1 | 4/2002 | Tzannes et al. |
| 2003/0014718 | A1* | 1/2003 | De Souza et al. ............ 714/804 |
| 2003/0126538 | A1 | 7/2003 | Mejean et al. |
| 2004/0034828 | A1* | 2/2004 | Hocevar ..................... 714/800 |
| 2004/0098659 | A1 | 5/2004 | Bjerke et al. |
| 2004/0141548 | A1 | 7/2004 | Shattil |
| 2005/0034053 | A1 | 2/2005 | Jacobsen et al. |
| 2005/0091570 | A1 | 4/2005 | Eroz et al. |
| 2005/0160351 | A1* | 7/2005 | Ko et al. ..................... 714/801 |
| 2005/0283707 | A1 | 12/2005 | Sharon et al. |
| 2005/0283709 | A1* | 12/2005 | Kyung et al. ................ 714/758 |
| 2006/0036923 | A1 | 2/2006 | Hedberg et al. |
| 2006/0087961 | A1 | 4/2006 | Chang et al. |
| 2006/0123241 | A1* | 6/2006 | Martinian et al. ........... 713/186 |
| 2006/0123277 | A1 | 6/2006 | Hocevar |
| 2006/0140294 | A1 | 6/2006 | Hottinen et al. |
| 2007/0022352 | A1 | 1/2007 | Eroz et al. |
| 2007/0041458 | A1 | 2/2007 | Hocevar et al. |
| 2007/0064828 | A1 | 3/2007 | Aldana et al. |
| 2007/0101229 | A1 | 5/2007 | Niu et al. |
| 2007/0143655 | A1 | 6/2007 | Niu et al. |
| 2008/0256426 | A1* | 10/2008 | Reid et al. .................. 714/801 |

OTHER PUBLICATIONS

T.J. Richardson, M.A. Shokrollahi and R.L Urbanke, "Design of capacity-approaching irregular low-density parity-check codes", IEEE Transactions on Information Theory, Feb. 2001, pp. 619-637, vol. 47, No. 2.

Tong Zhang and K.K Parhi, "Joint (3, k)-regular LDPC code and decoder/encoder design", IEEE Transactions on Signal Processing, Apr. 2004, pp. 1065-1079, vol. 52, No. 4.

Engling Yeo, Borivoje Nikolic and V. Anantharam, "Iterative decoder architectures", IEEE Communications Magazine, IEEE, Aug. 2003, pp. 132-140, vol. 41, No. 8.

T.J. Richardson and R.L. Urbanke, "Efficient encoding of low-density parity-check codes", IEEE Transactions on Information Theory, Feb. 2001, pp. 638-656, vol. 47, No. 2.

Sae-Young Chung, T.J. Richardson and R.L. Urbanke, "Analysis of sum-product decoding of low-density parity-check codes using a Gaussian approximation", IEEE Transactions on Information Theory, Feb. 2001, pp. 657-670, vol. 47, No. 2.

X.Y. Hu, E. Eleftheriou and D.M. Arnold, "Progressive edge-growth Tanner graphs", IEEE Globecom 2001, pp. 995-1001.

D.J.C. MacKay and R.M. Neal, "Neal Shannon limit performance of low density parity check codes," Electronics Letters, Mar. 13, 1997, p. 457-458, vol. 33, No. 6.

S.A. Mujtaba, "TGNSync Proposal Technical Specification," doc.: IEEE 802.11-041889r0, Aug. 2004, pp. 1-135.

Kose, C. and Edwards, B., "WWiSE Proposal: High throughput extension to the 802.11 Standard," a contribution to IEEE 802.11, 11-05-0149r2, Mar. 2005, pp. 1-93.

Van Veen, B.D. and Buckley, K.M., "Beamforming: A Versatile Approach to Spatial Filtering," ASSP Magazine, IEEE, vol. 5, Issue 2, Apr. 1988, pp. 4-24.

Barton, M., "Unequal Error Protection for Wireless ATM Applications," 1996, IEEE, pp. 1911-1915.

S.A. Mujtaba, "TGn Sync Proposal Technical Specification," doc.: IEEE 802.11, 11-04-0889r44, Mach 2005, pp. 1-162.

Livshitz, M., et al., "TGnSync-Shortening Puncturing_March 16," Nortel's PowerPoint presentation in LDPC subgroup a contribution for 802.11n, Mar. 16, 2005, pp. 1-14.

U.S. Office Action for U.S. Appl. No. 11/261,527 mailed on Jul. 10, 2008 by Examiner.

U.S. Office Action for U.S. Appl. No. 11/261,527 mailed on Mar. 16, 2009 by Examiner.

U.S. Office Action for U.S. Appl. No. 11/313,906 mailed on Mar. 2, 2009 by Examiner.

U.S. Office Action for U.S. Appl. No. 11/313,906 mailed on Aug. 18, 2008 by Examiner.

U.S. Office Action for U.S. Appl. No. 11/313,402 mailed on Aug. 15, 2008 by Examiner.

U.S. Office Action for U.S. Appl. No. 11/313,402 mailed on Jan. 29, 2009 by Examiner.

El Gamal, "Analyzing the Turbo Decoder Using the Gaussian Approximation," IEEE Transactions on Information Theory, vol. 47, No. 2, Feb. 2001, pp. 671-686. Italy.

LDPC-codes, "Low-density Parity-check codes," http//www.ldpc-codes.com/faq.html, pp. 1-2. US.

Xiao, et al., Improved Progressive-Edge Growth (PEG) Construction of Irregular LDPC Codes, IEEE Communications Letters, vol. 8, No. 12, Dec. 2004, pp. 715-717. Canada.

U.S. Notice of Allowance for U.S. Appl. No. 11/261,527 mailed on Oct. 16, 2009 by Examiner.

U.S. Notice of Allowance for U.S. Appl. No. 11/313,906 mailed on Jun. 10, 2009 by Examiner.

U.S. Final Office Action for U.S. Appl. No. 11/313,402 mailed on Jul. 10, 2009 by Examiner.

U.S. Notice of Allowance for U.S. Appl. No. 11/313,402 mailed on Sep. 8, 2009 by Examiner.

* cited by examiner

METHOD OF GENERATING STRUCTURED IRREGULAR LOW DENSITY PARITY CHECKCODES FOR WIRELESS SYSTEMS

FIELD OF THE INVENTION

The present invention related to wireless systems, and in particular, to structured irregular Low Density Parity Check codes for wireless systems.

BACKGROUND OF THE INVENTION

Low Density Parity Check (LDPC) codes have recently attracted considerable attention owing to their capacity-approaching performance and low complexity iterative decoding. LDPC codes can be applied to a wide range of applications such as wireless communications, satellite communications and storage.

An example wireless system is a 802.11n communication. FIG. 1 shows a functional block diagram of a conventional transmitter 100. The user information bits are encoded using a short to moderate block length Low Density Parity Check (LDPC) code in an LDPC Encoder 102. The encoded bits then pass through a bit-by-bit round robin Spatial Parser 104, followed by the usual Constellation Mapper 106, and OFDM modulation including Inverse FFT 108, Guard Interval (GI) Window 110 and RF modulation windowing 112. In such a transmitter 100, the decoding data rates must be over 100 Mbps, which are not favorable for turbo coding. LDPC codes, which are designed for parallel implementation, provide a good alternative for satisfying stringent requirements in terms of block error rate and decoding throughput.

LDPC code is a type of linear block coding and can be uniquely defined by a parity check matrix H. The code rate is $R=M/N$, where N is the number of columns in the H matrix, representing the size of the code, and M is the number of rows in the H matrix, representing the number of parity check equations. An example of a linear block code with $N=7$, $M=3$, is shown in relation (1) below:

$$H = \begin{bmatrix} 1 & 0 & 1 & 0 & 1 & 0 & 1 \\ 0 & 1 & 1 & 0 & 0 & 1 & 1 \\ 0 & 0 & 0 & 1 & 1 & 1 & 1 \end{bmatrix} \quad (1)$$

LDPC codes can be effectively represented using a bipartite graph. The nodes in the graph are separated into two distinctive sets and edges are only connecting nodes of two different types. The two types of nodes in the bipartite graph are called bits nodes and check nodes. One bit node represents one bit in the codeword, corresponding to one column of the parity check matrix H. One check node represents one parity check equation, corresponding to one row of the parity check matrix H. FIG. 2 shows a graph representation 200 of the (7,4) parity check codes given in relation (1) above. In the graph 200 of FIG. 2, an open circle (○) represents the bit node, and a solid square (■) represents the check node.

LDPC codes can be efficiently decoded using a message-passing algorithm. Such an algorithm operates on the bipartite graph by iteratively updating the soft message. Examples of message-passing algorithms can be found in R. G. Gallager, "Low density parity check codes", IRE Trans. Inform. Theory, Vol. IT-8, pp. 21-28, January 1962, and in D. J. C. MacKay and R. M. Neal, "Neal Shannon limit performance of low density parity check codes," Electronics Letters, vol. 32, pp. 1645-1646, 1996.

There are two kinds of LDPC codes, regular and irregular. A regular LDPC code contains t number of 1's per-row (row weight) and s number of 1's per column (column weight), where $s=t*(1-R)$. An irregular LDPC code contains uneven number of 1's per-column and per-row. For example, the H matrix in relation (1) is an irregular code. It has been known that irregular LDPC codes outperform regular LDPC codes and have decoding thresholds very close to Shannon capacity. Design of good irregular code ensemble for randomly generated codes is presented in T. J. Richardson, M. A. Shokrollahi and R. L Urbanke, "Design of capacity-approaching irregular low-density parity-check codes", IEEE Transactions on Information Theory, Volume: 47, Issue: 2, February 2001, Pages: 619-637. A general technical called density evolution is proposed to find the best code weight distribution which provides the best code ensemble. This weight distribution provides design guideline for infinite size LDPC codes. The effectiveness of the design is verified by randomly generated large LDPC codes.

Although randomly generated long LDPC codes (over 10K size) have threshold-approaching performance, the design of short codes with reasonably good performance has been a challenge. Furthermore, the design of LDPC codes that are fit for hardware implementation such as ASIC is very important, especially for 802.11n systems where the decoding throughput is required to be over 100 Mbps. Therefore, some conventional approaches introduce code structure in the LDPC code design to facilitate hardware implementation. For example, a block structured regular LDPC code design and the corresponding FPGA prototyping is presented in "H. Zhong and T. Zhang, "Block-LDPC: A Practical LDPC Coding System Design Approach", IEEE Transactions on Circuits and Systems I: Fundamental Theory and Applications, Volume 52, Issue 4, April 2005 Page (s) 766-775. However, the performance of such regular codes is below that of irregular codes.

BRIEF SUMMARY OF THE INVENTION

In one embodiment, the present invention provides a method of generating structured irregular LDPC codes, and LDPC encoding of data, for wireless networks such as wireless local area network (WLAN) systems, allowing systematic generation of improved code ensembles using density evolution, and providing essentially the best tradeoff between decoding performance and decoding complexity. Such an LDPC code has a higher diversity order for multiple-input-multiple-output (MIMO) systems, with better built-in interleaving capability. Further, the code dimension can be tailored to 802.11n system parameters such as the number of sub-carriers and delay. The code also provides an improved girth control scheme, provides flexible length with different expanding factors, and supports simple encoding and shortening for multiple rates.

As such, in one implementation the present invention provides a method of generating LDPC codes by systematically generating irregular LDPC code ensembles using density evolution by trading off between decoding threshold and decoding complexity. The method can further include the steps of: determining the code weight distribution of the code ensemble based on density evolution with Gaussian approximation, wherein decoding threshold is traded off for decoding complexity; determining a base matrix dimension based on the number of sub-carriers per OFDM symbol, minimum number of data streams, and the constellation size; generating an expanding matrix to eliminate cycles and optimize girth distribution; and adjusting the base matrix for shortening by rearranging the columns to support the code shortening.

The above steps provide an ensemble of desirable LDPC codes according to an embodiment of the present invention. These, and other features and advantages of the present invention will be apparent from the following specification taken in conjunction with the following drawings.

BRIEF DESCRIPTION OF THE DRAWINGS

FIG. 8 shows an example of rate 1/2 irregular LDPC code according to the present invention;

DETAILED DESCRIPTION OF THE INVENTION

In one embodiment, the present invention provides a method of generating structured irregular LDPC codes, and LDPC encoding of data, for a wireless networks such as wireless local area network (WLAN) systems, allowing systematic generation of improved code ensembles using density evolution, and providing essentially the best tradeoff between decoding performance and decoding complexity. Such an LDPC code has a higher diversity order for multiple-input-multiple-output (MIMO) systems, with better built-in interleaving capability. Further, the code dimension can be tailored to 802.11n system parameters such as the number of sub-carriers and delay. The code also provides an improved girth control scheme, provides flexible length with different expanding factors, and supports simple encoding and shortening for multiple rates.

Figure 3:
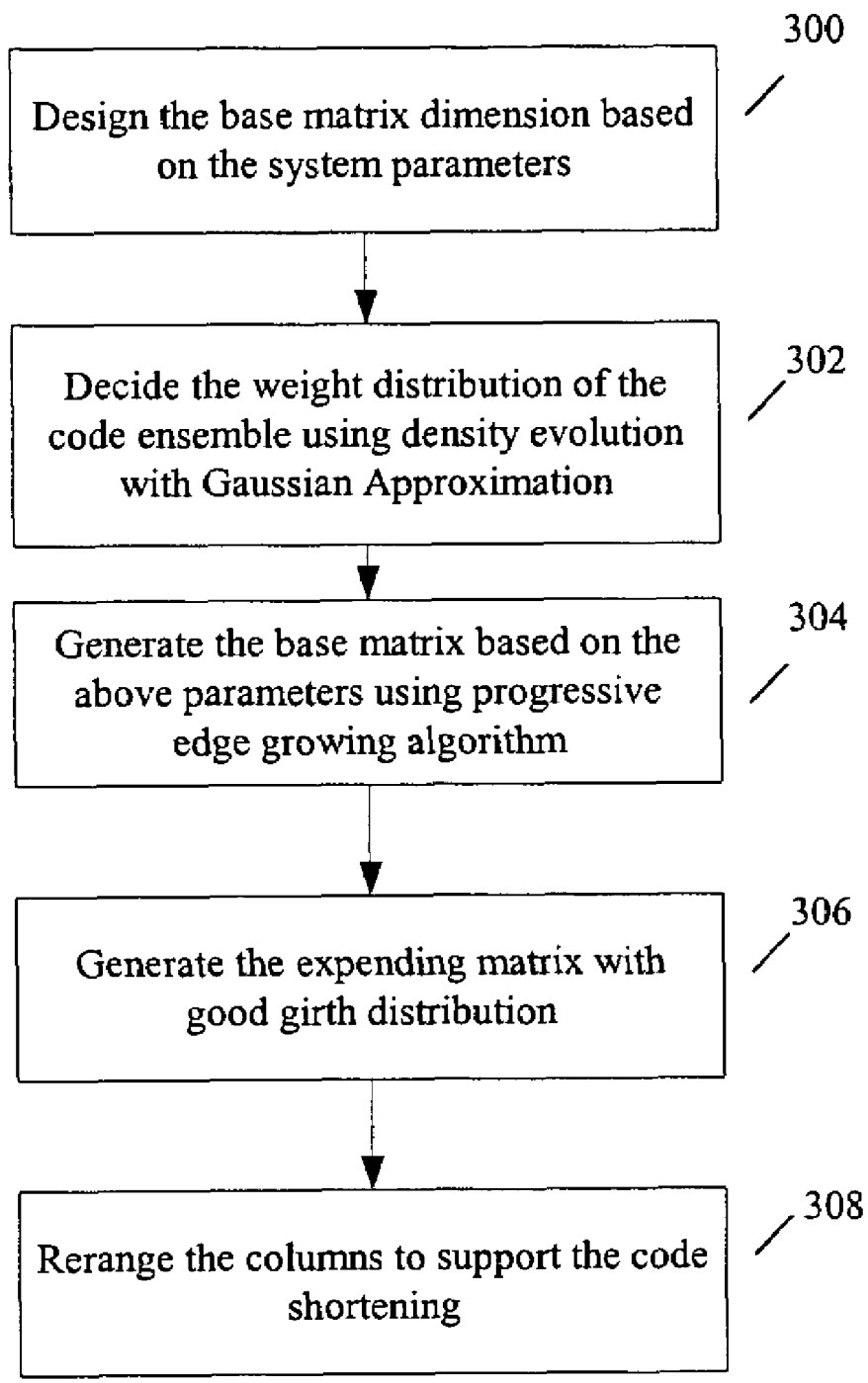
FIG. 3 shows a flowchart of the steps of an embodiment of a method of generating a structured irregular LDPC code according to the present invention.

FIG. 3 shows a flowchart of an example systematic process for generating improved irregular LDPC codes according to the present invention. Such a code can be utilized to encode data for transmission from e.g. MIMO transmitter and decoding in a MIMO receiver. In the following, the steps in FIG. 3 are described.

Step 300: Determine base matrix dimension based on the number of sub-carriers per Orthogonal Frequency Division Multiplexing (OFDM) symbol, minimum number of data streams, and the constellation size. For example, assuming a 20 MHz system with 48 data tones, the modulation is BPSK, QPSK, 16QAM, 64QAM, and minimum number of antennas is 2. In this case, the M'×N' base matrix is selected to be N'=48 or 24, M'=N'*(1−R). For a 40 MHz example system, there are 108 data tones, same modulation and antennas; therefore, the selection can be N'=36 or 72 depending on the decoding architecture and throughput. A 20 MHz and a 40 MHz 802.11n example system is described in "TGn Sync Proposal Technical Specification," doc.: IEEE 802.11-04/889r0, August 2004, Pages: 1-143 (incorporated herein by reference). The base matrix size can be derived similarly with other system parameters.

Step 302: Determine the code weight distribution of the code ensemble based on density evolution with Gaussian approximation. The distribution should jointly consider the decoding complexity and decoding threshold. Basic design tradeoff is that the decoding threshold gets closer to the Shannon capacity as the complexity increases. Because a 802.11n system requires high-throughput with low complexity decoding, decoding threshold is traded off for decoding complexity. In one example, the trade off involves two steps. The first step involves determining the desired average row weight (average check node degree) and maximum column weight based on the desired hardware complexity. The hardware complexity is related to the average row weight and maximum column weight as follows: (1) The size of the memory required is dependent on the total number of edges in the particular code design, which can be represented by the average row weight; as an LDPC decoder requires several times larger memory than that of a turbo decoder, low average weight design is preferred to reduce the memory requirement, and (2) Large maximum column weight introduces detrimental arithmetic precision effects and the complexity of collating a large number of inputs and outputs at the processing elements. The exact tradeoff varies depending on different system requirements. For example, for a rate R=2/3 code LDPC design, there are two check node degrees as: 10 and 11. The average row degree is 10.125. The maximum column weight is 7.

In the second step, in order to support different efficient encoding schemes, the parity portion of the matrix H is fixed to be dual-diagonal. In this case, the number of weight 2 column is also decided. In the previous example, the weight 2 column in the base is fixed to 7. Also the number of edges connected to the check nodes need to be equal to the number of edges connected to the bit nodes. Further, density evolution is used to find the best weight distribution with the lowest decoding threshold satisfying: (1) average row weight, (2) fixed weight 2 columns numbers, and (3) maximum column weight.

Step 304: Generate the base matrix which has the same distribution in step 302 and dimension determined in step 300. Furthermore, the base matrix is selected to provide desired build-in interleaving capability to achieve better performance for MIMO fading channels. LDPC parity check matrix is designed in a way that enables simple encoding as well. It can be represented in the following form:

$$H = [H^d | H^p]$$

$H^d$ is an M×K matrix and corresponds to the "data" bits of the codeword. $H^d$ is designed using progressive edge growing (PEG) algorithm which maximizes the girth of the base matrix while following the code distribution with best effort. This design ensures high coding gain. $H^p$ is an M×M modified "dual diagonal" matrix, which corresponds to the "parity" bits of the codeword. LDPC codes applied here are systematic and canonic block codes. Codewords have the following structure:

$$c = \begin{bmatrix} d \\ p \end{bmatrix}$$

where $d=[d_0, d_1, \ldots, d_{K-1}]^T$ is the block of (uncoded) data bits and $p=[p_0, p_1, \ldots, p_{M-1}]^T$ are the parity bits.

Because of the small size of the base matrix, cycles always exist, although the PEG algorithm heuristically maximizes the girth. Therefore, all the cycles are counted and listed, to eliminate them by adjusting the expanding matrix (generating the expanding matrix is described in step 306 further below).

Figure 4:
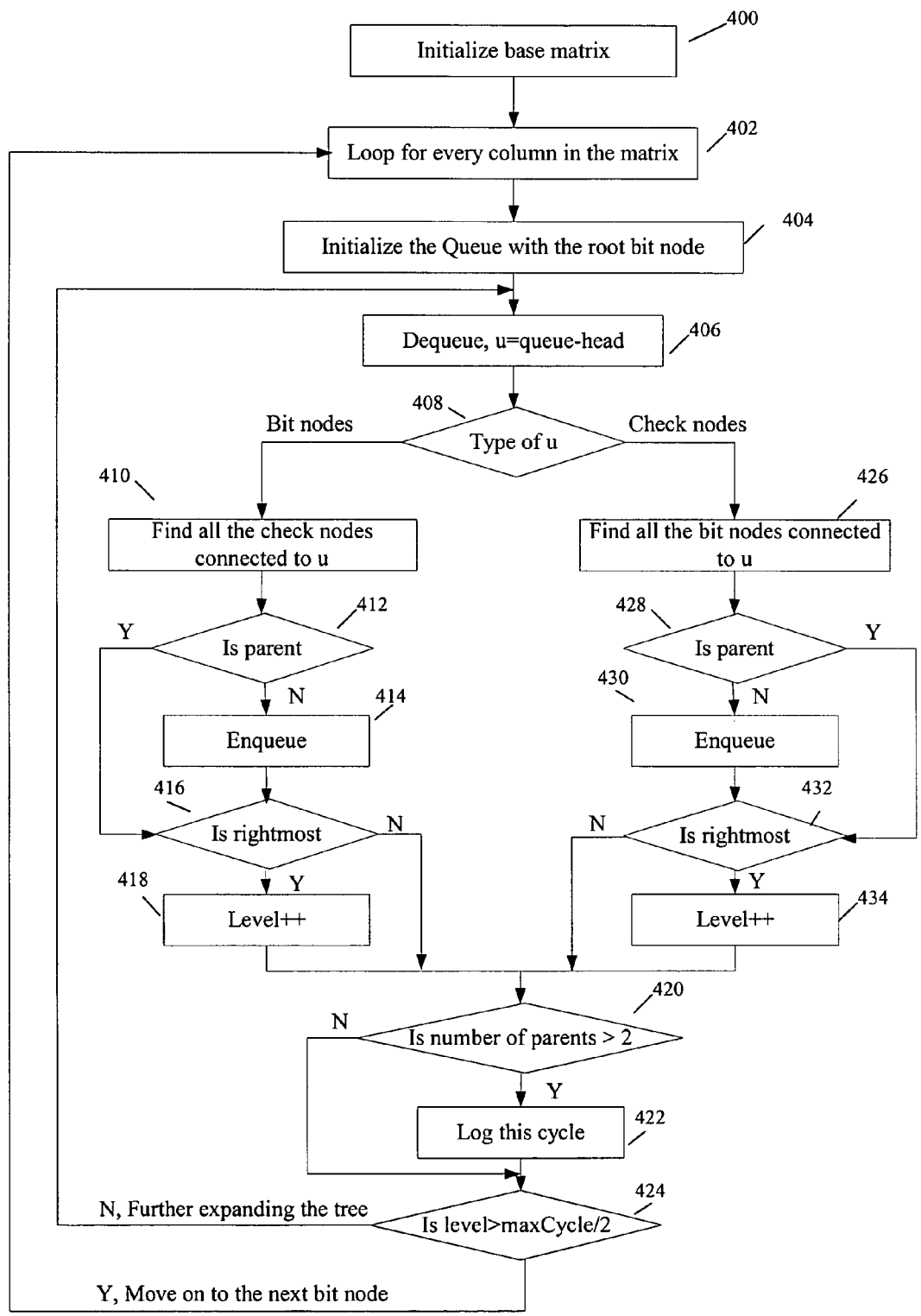
FIG. 4 shows a flowchart of the steps of a method of spanning-tree algorithm for counting cycles, according to an embodiment of the present invention.

FIG. 4 shows a flowchart of an example cycle counting on the graph by a breath first search, implementing a spanning-tree algorithm for counting cycles, comprising the steps of: initializing the base matrix (step 400); looping for every column in the matrix (step 402); initializing a queue with the root bit node (step 404), wherein the queue includes bit nodes and check nodes that have been put into the queue (initially, the queue is empty and in step 404 the first bit node is placed into the queue, with more nodes enqueued in step 414 below); dequeue and set u=queue-head (u is the head pointer used in the search) (step 406) wherein the dequeue operation takes the queue head and moves the pointer to the second node; determining if u is a bit node or a check node (step 406); if bit nodes, then finding all the check nodes connected to u (step 410); determining if a found node if a parent (step 412); if not a parent, then enqueue the found check node that is not a parent (step 414); determining if the found node is the rightmost of the check node of current tree level (e.g., in FIG. 5A, C3 is the rightmost check node in level 2) (step 416); if so, then incrementing the tree level (step 418); determining if the number of parents is greater than two wherein the number of parents corresponds to the length of the cycle in the graph (step 420); if so, logging this cycle (step 422); determining of the level is greater than maxCycle/2, wherein MaxCycle is the largest cycle length to remove (in general, MaxCycle should be as large as possible, however, the larger the MaxCycle, the more difficult is finding such graph; in this embodiment, MaxCycle to 6 for low rate code such as rate 1/2 and rate 2/3 code, and MaxCycle is set to 4 for high rate codes such as rate 3/4 and rate 5/6 code) (step 424); if not, then further expanding the tree by proceeding to step 406, and if so, then proceeding to processing the next bit node in step 402.

In step 408 above, if type of u is check nodes, then the process proceeds to if check nodes, then finding all the bit nodes connected to u (step 426); determining if a found node if a parent (step 428); if not a parent, then enqueue the found bit node which is not a parent (step 430); determining if the found node is the rightmost bit node in the current tree level (e.g., in FIG. 5A, V6 is the rightmost check node in level 3) (step 432); if so, then incrementing the tree level (step 434), and proceeding to step 420 for further processing as described above.

Figure 5A:
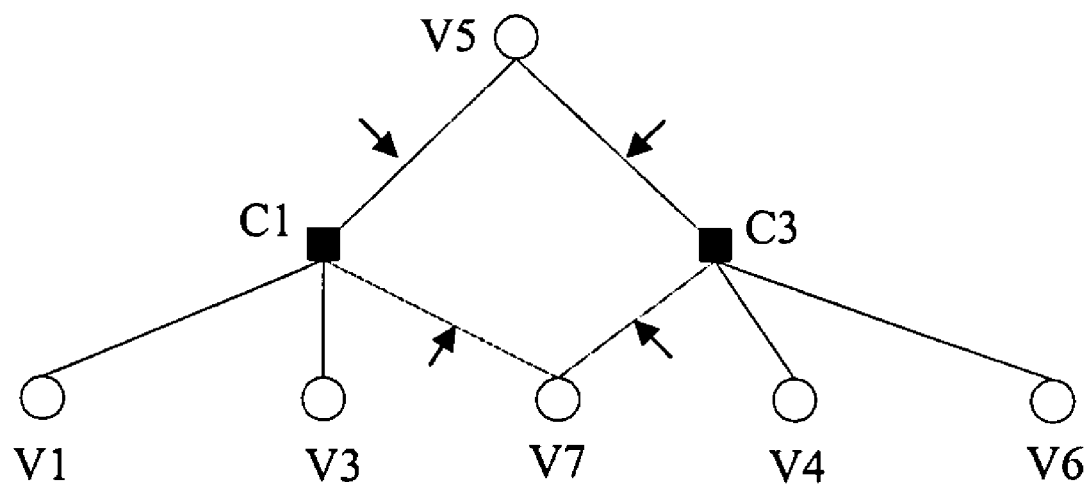
FIG. 5A shows an example graph of counting cycles using the spanning-tree algorithm of FIG. 4.

FIG. 5A shows an example graph 500 of counting cycles using the spanning-tree algorithm of FIG. 4, based on the H matrix of relation (1) above. In graph theory, a tree is a connected acyclic graph. A rooted tree is such a graph with a vertex singled out as the root. In this case, any two vertices connected by an edge inherit a parent-child relationship. For example, FIG. 5A shows a tree structure. V5 has two children C1 and C3. C1 has a parent V5 and three children V1, V3 and V7. V5 is the root of the tree, which belong to level 1. C1 and C3 are at the second level. V1, V3, V7, V4, V6 belong to the third level. Each level has its rightmost node. For example, C3 is the rightmost node for second level while V6 is the rightmost node for the third level. A queue is a basic data structure which in one example follows a first in first out (FIFO) rule.

Figure 2:
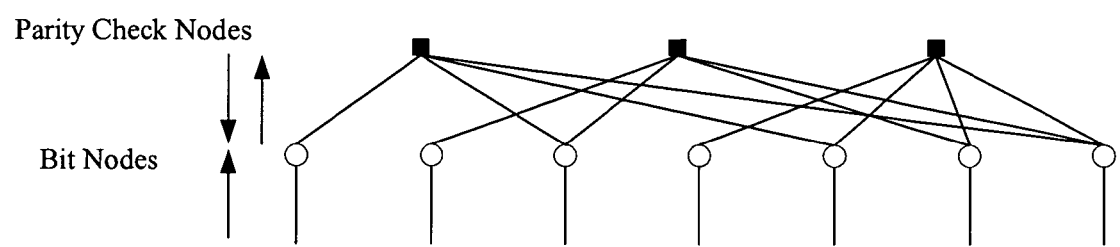
FIG. 2 shows an example LDPC code graph.
Figure 5B:
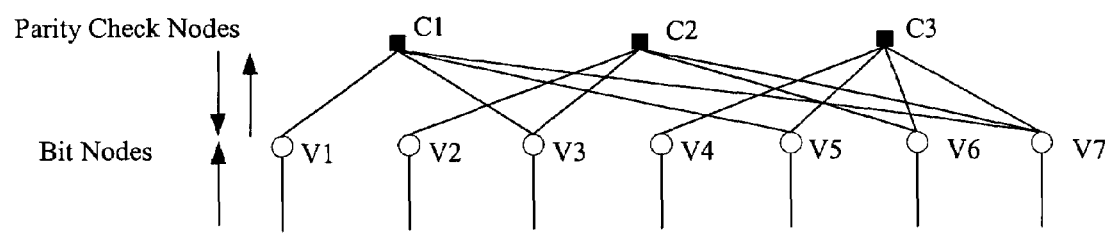
FIG. 5B shows a further example graph of counting cycles using the spanning-tree algorithm of FIG. 4.

C's presents check nodes. V's represents variable nodes. FIG. 5A shows an example of finding a cycle using the search algorithm in the code graph as shown in FIG. 2. The cycle length is 4, involving nodes V5, C1, C3 and V7 (indicated by arrows). In this example, MaxCycle=4 to find out all cycles with length 4. Following the process algorithm specified in the flowchart of FIG. 4, the search begins from V1, and continues onto V2, V3, V4. No. cycle 4 is found for those bit nodes. For V5, the queue head is a bit node (step 408), so the process finds all the check nodes C1 and C3 are connected to V5 (step 410). C1 and C3 are the children of V5, not parents, so C1 and C3 are placed into the queue and form the second level of the tree. The process goes on in expanding the tree to the third level. Now u points to check bits for C1 which is in the queue (step 408). C1 has 4 bit nodes that are connected to it (i.e., V1, V3, V5 and V7) (step 426). V5 is the parent of C1, so V5 is not placed back to the queue (step 428), while V1, V3 and V7 are placed in the queue and form the third level of the tree. C3 is processed similarly, whereby the three is tree expanded to the third level. It can be seen that V7 has two parents (step 420), and as such so it is reported that a cycle is found, and it is logged (step 422). Process continues to V6 after V5 is processed, generating the graph in FIG. 5B.

Referring back to FIG. 3, Step 306: Generate the expanding matrix to eliminate cycles, and optimize the girth distribution. It is widely accepted that cycle-4 in the parity check matrix will cause slow convergence and error floor. Therefore, the object of expanding matrix is to avoid cycles in the code graph.

Figure 6:
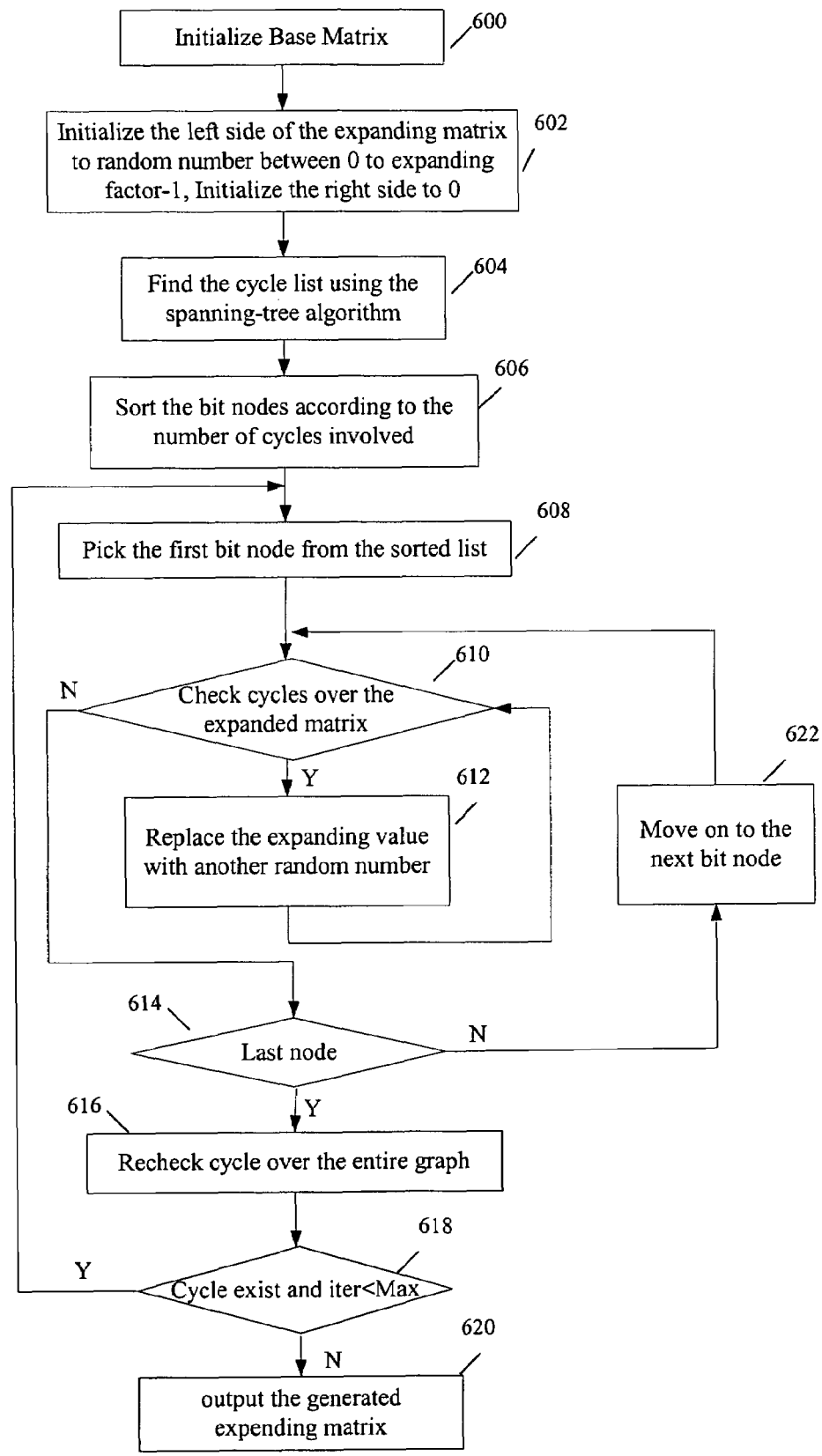
FIG. 6 shows a flowchart of the steps of a method of generating an expanded matrix, according to an embodiment of the present invention.

FIG. 6 shows a flowchart of example steps for generating the expanding matrix, comprising the steps of: initializing the base matrix (step 600); initializing the left side of the expanding matrix (left side is Hd) to a random number between 0 and an expanding factor −1 (expanding factor is determined by the code length N and base matrix dimension, e.g., for a rate 1/2 code with length N=1728, the base matrix dimension is 24×12, and the expanding factor is 1728/24=72) (step 602); finding the cycle list using the spanning-tree algorithm such as in FIG. 4 above (step 604); sorting the bit nodes according to the number of cycles involved (step 606); picking the first bit node from the sorted list (step 610); checking the cycles over the expanded matrix to determine whether there is a cycle or not based on the example process in FIG. 4 (step 610); if so, then replacing the expanding value with another random number and proceeding back to step 610 (step 612), otherwise determining if the current node is the last node (step 614); if so, then rechecking the cycle over the entire code graph (e.g., FIG. 2) (step 616); determining if cycle exists and if the current iteration is less than MaxCycle (step 618); if not, then outputting the generated expanded matrix (step 620), otherwise, proceeding back to step 608. In step 614, if the current node is not the last node, then moving on to the next bit node (step 622), and proceeding back to step 610 for further processing.

Figure 7:
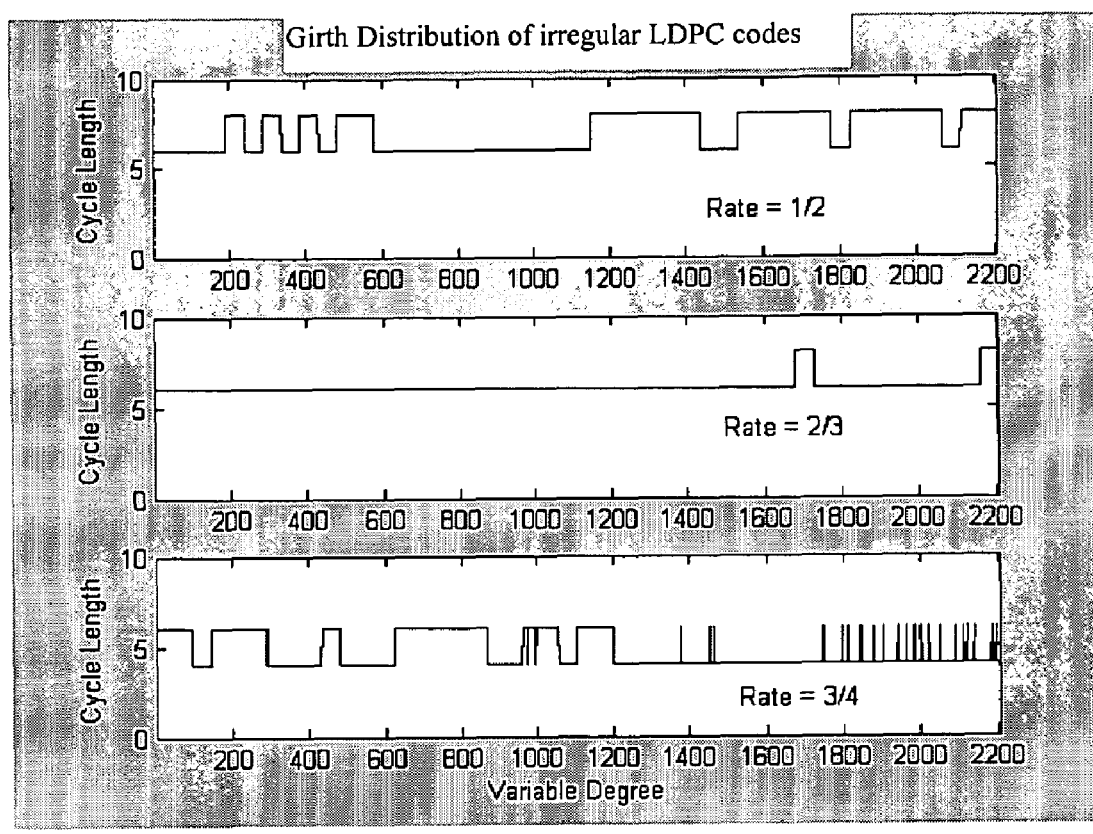
FIG. 7 shows an example girth distribution of an LDPC code according to the present invention.

FIG. 7 shows the girth histogram for the design code example, according to the present invention. FIG. 7 shows the number of cycles related to each node. The code length is 2304, the x-axis represents Vn, n=1 to 2304. The y-axis represents the cycle length. The top plot in FIG. 7 is the cycle length histogram for rate 1/2 code, where it can be seen that all length 4 cycles are eliminated. Similar observations for rates 2/3 and 3/4 are shown by the middle and bottom plots in FIG. 7. Specifically, the middle plot in FIG. 7 is the cycle length histogram for rate 2/3 code, where it can be seen that length 4 cycles are eliminated. The bottom plot in FIG. 7 is the cycle length histogram for rate 3/4 code, where length 4 cycles are eliminated for the best effort (the length 4 cycles in rate 3/4 can not be fully removed due to the small matrix size). Another important role of the expanding matrix is that by adjusting different expanding factors, we can get different code size.

Referring back to FIG. 3, Step 308: Adjust the base matrix for shortening, by rearranging the columns to support the code shortening. Using PEG to generate base matrix places the low weight nodes before the high weight nodes. To obtain good performance for shortening, the columns are permuted such that after shortening, the code weights are distributed as evenly as possible.

Figure 8:
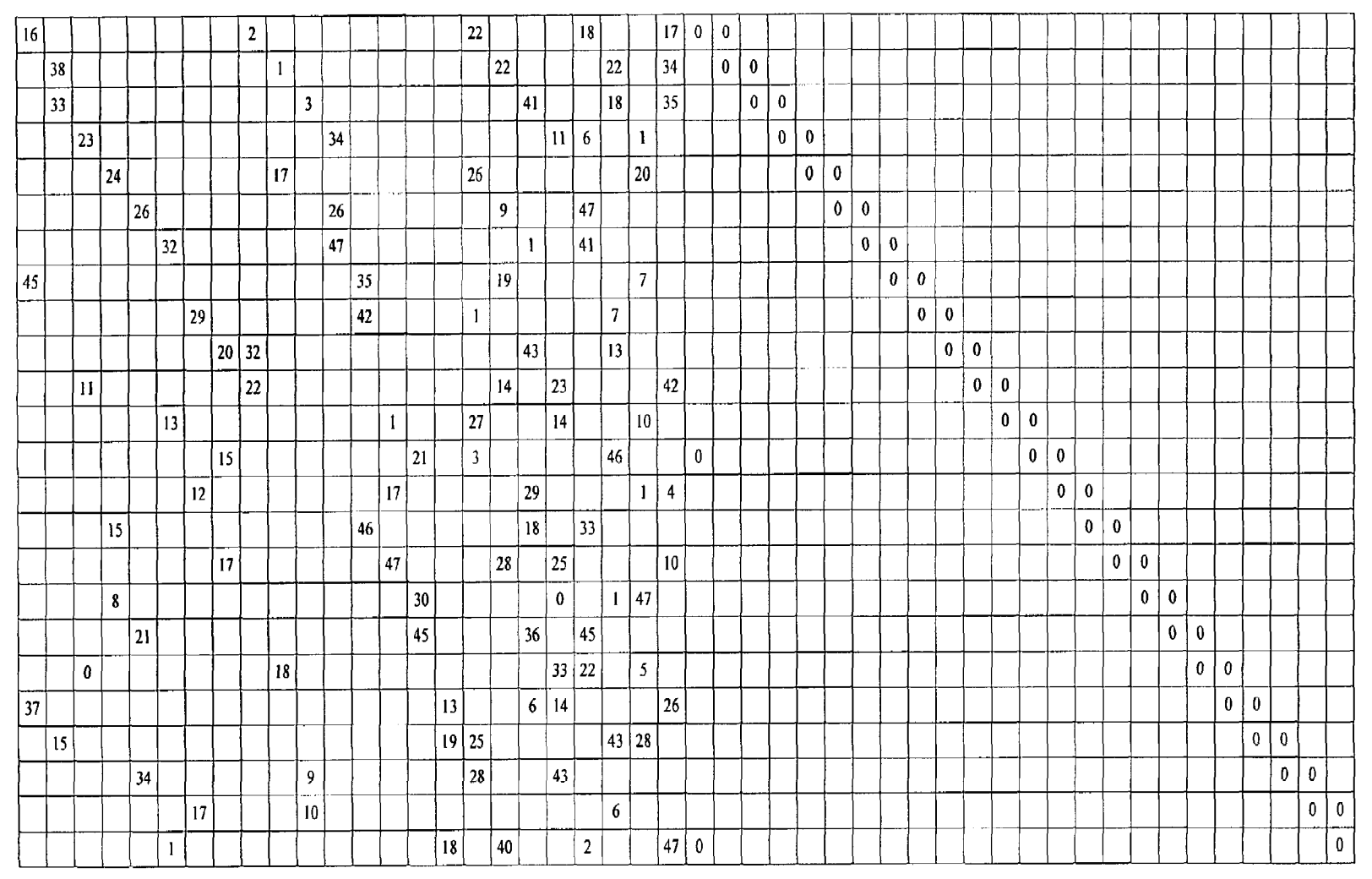
Figure 9:
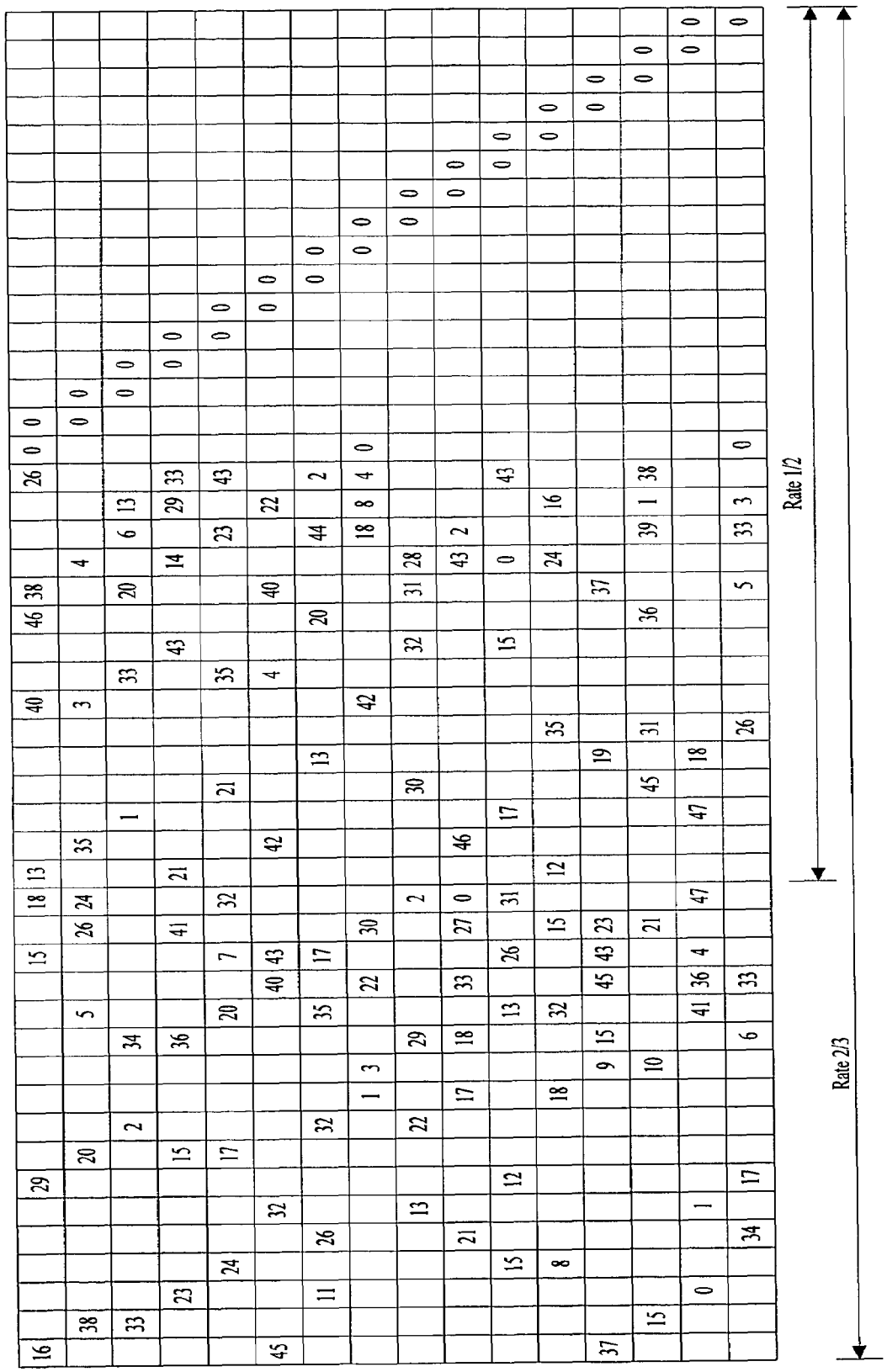
FIG. 9 shows an example of rate 2/3 irregular LDPC code according to the present invention.
Figure 10:
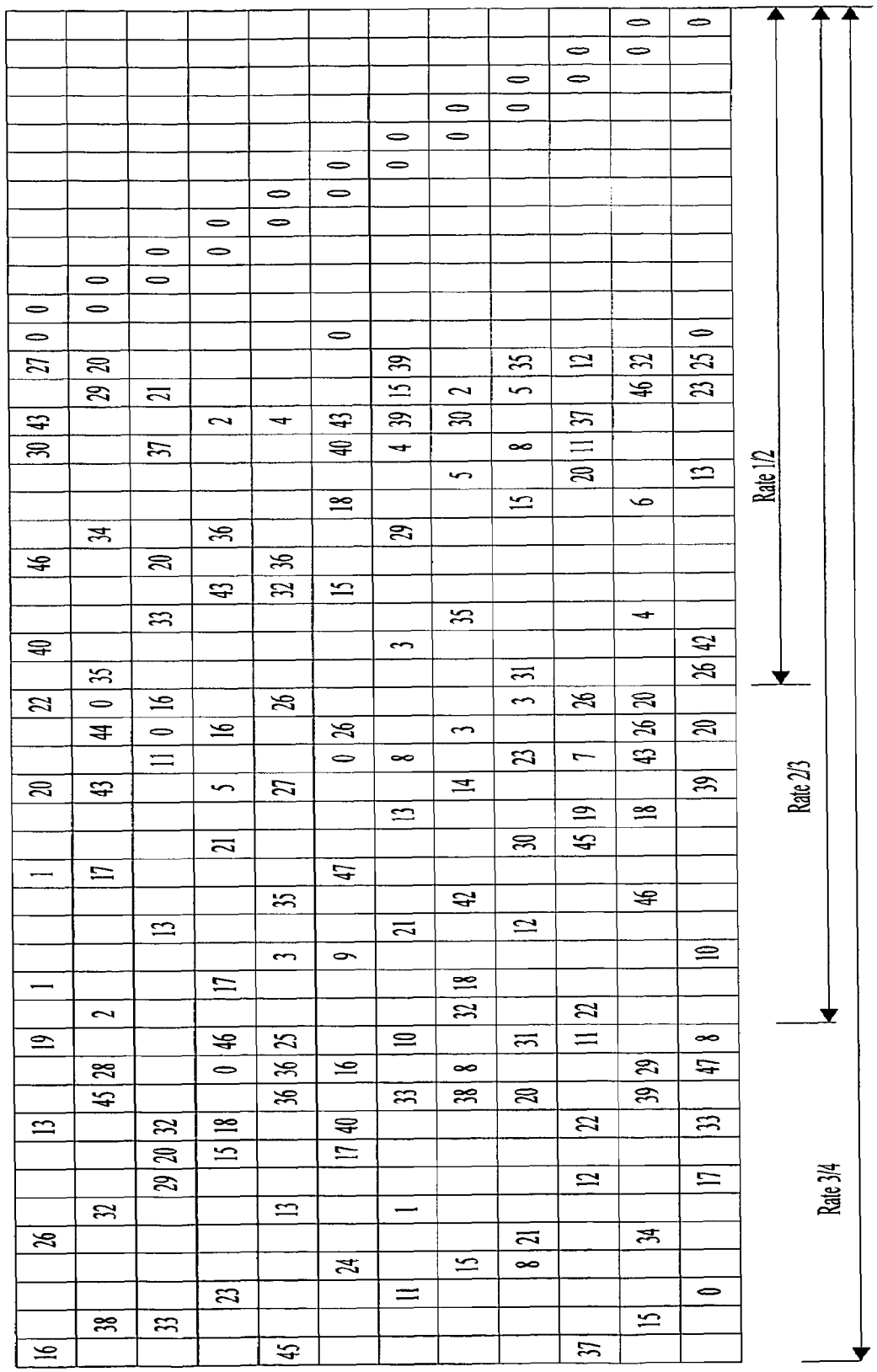
FIG. 10 shows an example of rate 3/4 irregular LDPC code according to the present invention.

The above steps provide an ensemble of desirable LDPC codes according to an embodiment of the present invention. The designed code can be of any code length by adjusting the base matrix size and expanding factor to different system parameters. Three examples with rates 1/2, 2/3 and 3/4, N'=48, are shown in FIGS. 8-10, respectively, according to embodiment of the present invention. One base matrix example is shown per code rate. Size of a base parity check matrix is denoted as $M_b \times N_b$. $N_b$, the number of columns in the base matrix, is fixed for all code rates, $N_b=48$. $M_b$, the number of rows in the base matrix, depends on the code rate as follows: $M_b=N_b(1-R)$. Parity check matrix H of size M×N is generated by expanding the base matrix for the selected rate, $H_b$, z-times: $z=N/N_b=M/M_b$. In these examples, N=2304, z=2304/48=48. The expansion operation is defined by element values of the base matrix. Each non-empty base matrix element, s, is replaced by a z×z identity matrix, $I_z$, cyclically shifted to the right $s'=s_{mod(z)}$ times. Each empty element in the base matrix is replaced by a z×z zero matrix, $0_{z \times z}$ ($S_d$ shown below):

$$S_0 = \begin{bmatrix} i & & & & & & & & \\ & i & & & & & & & \\ & & i & & & & & & \\ & & & i & & & & & \\ & & & & i & & & & \\ & & & & & i & & & \\ & & & & & & i & & \\ & & & & & & & i & \\ & & & & & & & & i \end{bmatrix}$$

-continued $$S_3 = \begin{bmatrix} & i & & & & & & & \\ & & i & & & & & & \\ & & & i & & & & & \\ & & & & i & & & & \\ & & & & & i & & & \\ & & & & & & i & & \\ & & & & & & & i & \\ i & & & & & & & & \\ & i & & & & & & & \\ & & i & & & & & & \end{bmatrix}$$

Figure 11:
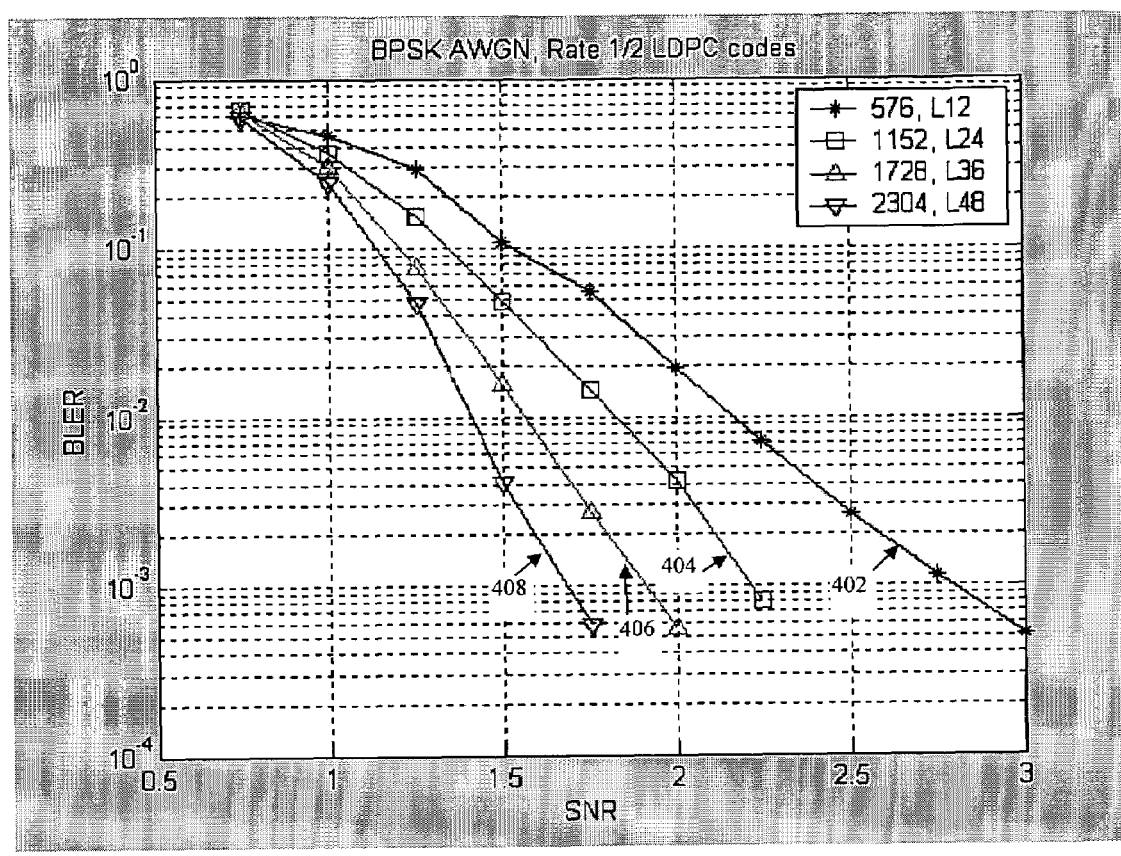
FIG. 11 shows an example binary phase shift keying (BPSK) additive white Gaussian noise (AWGN) performance for the rate 1/2 codes of FIG. 8.
Figure 12:
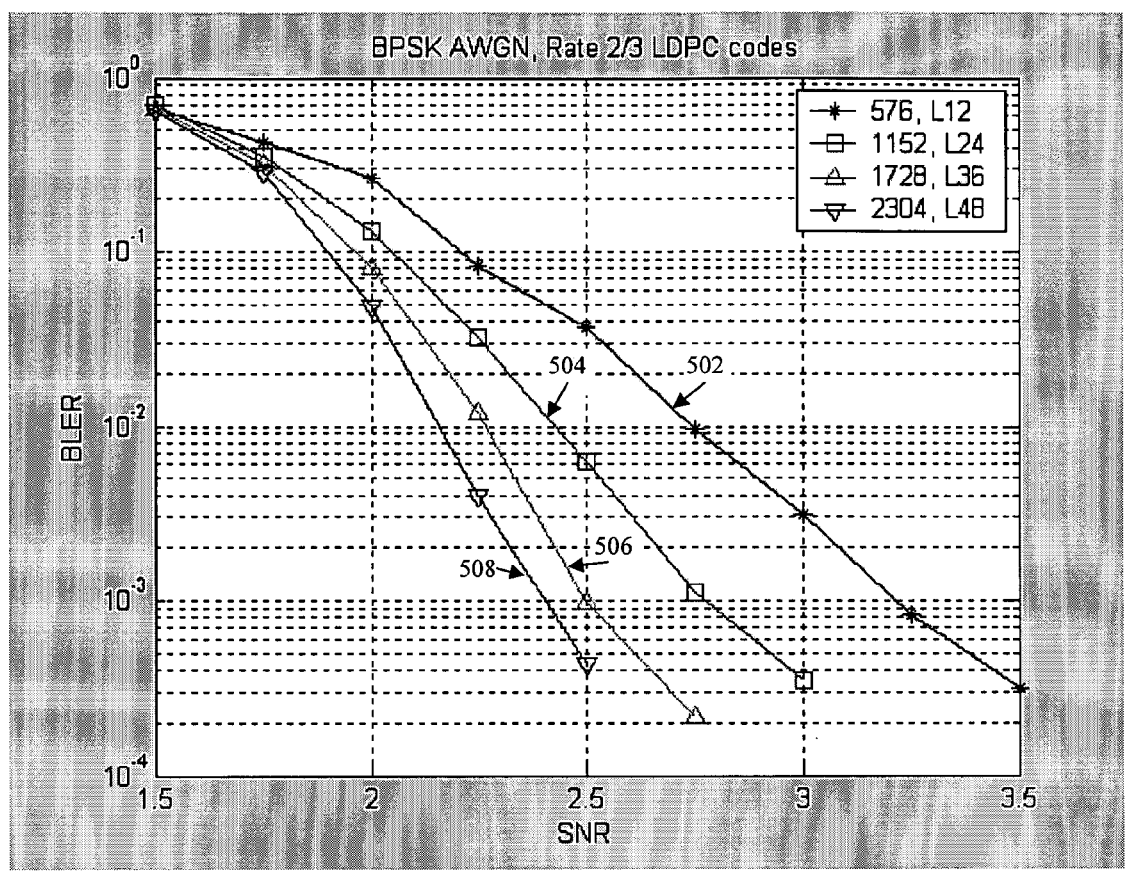
FIG. 12 shows an example BPSK AWGN performance for the rate 2/3 codes of FIG. 9.
Figure 13:
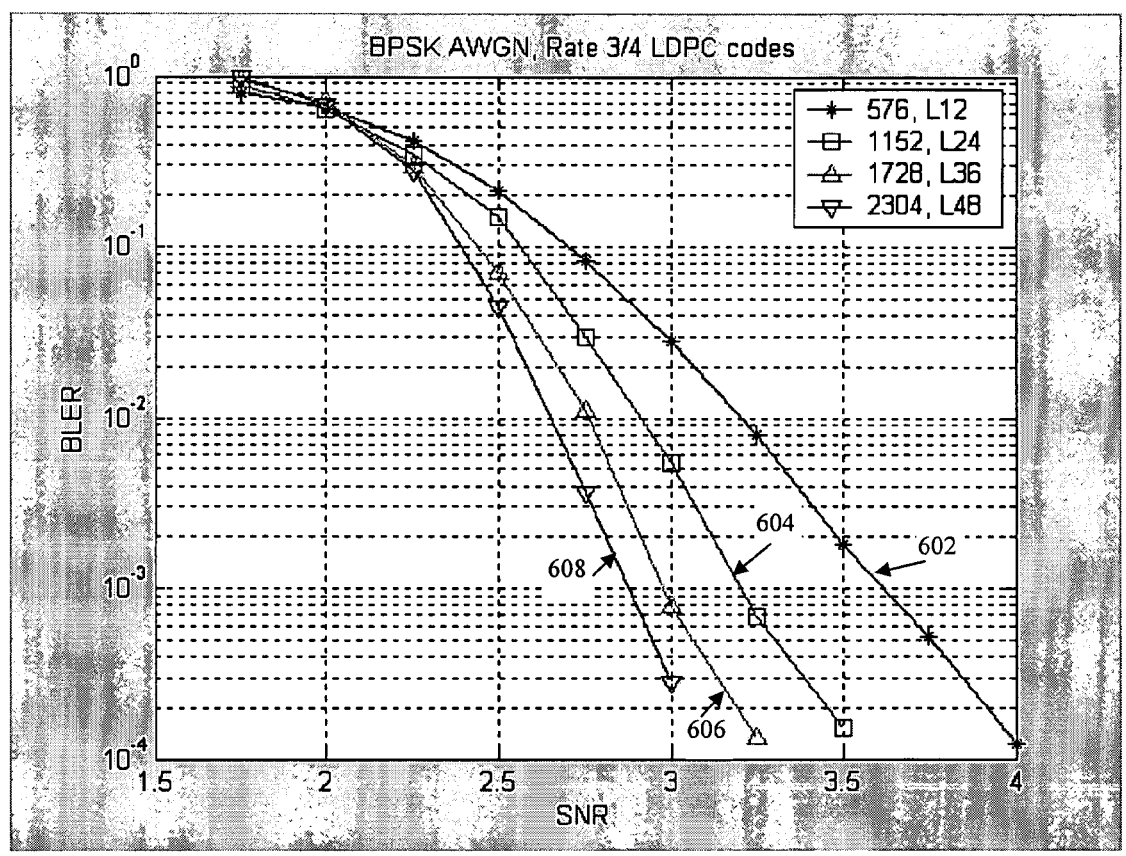
FIG. 13 shows an example BPSK AWGN performance for the rate 3/4 codes of FIG. 10.

The above method constructs a wide range of LDPC codes. Examples in FIGS. 11-13 show the code performance with different lengths, i.e., different expanding factors, using BPSK modulation over AWGN channels. FIG. 11 shows simulation result 400 using BPSK AWGN, Rate 1/2 LDPC codes for: code length 576, extension L12 (curve 402), code length 1152, extension L24 (curve 404), code length 1728, extension L36 (curve 406), and code length 2304, extension L48 (curve 408), as detailed in the legend. FIG. 12 shows simulation result 500 using BPSK AWGN, Rate 2/3 LDPC codes for: code length 576, extension L12 (curve 502), code length 1152, extension L24 (curve 504), code length 1728, extension L36 (curve 506), and code length 2304, extension L48 (curve 508), as detailed in the legend. FIG. 13 shows simulation result 600 using BPSK AWGN, Rate 3/4 LDPC codes for: code length 576, extension L12 (curve 602), code length 1152, extension L24 (curve 604), code length 1728, extension L36 (curve 606), and code length 2304, extension L48 (curve 608), as detailed in the legend. An example of the code according to the present invention performs 0.1-0.2 dB better than other irregular codes.

The code performance over 802.11n fading channels with higher modulation constellation is shown by example in FIGS. 14-17, illustrating the fading performance for the codes according to the present invention and conventional codes.

Figure 14:
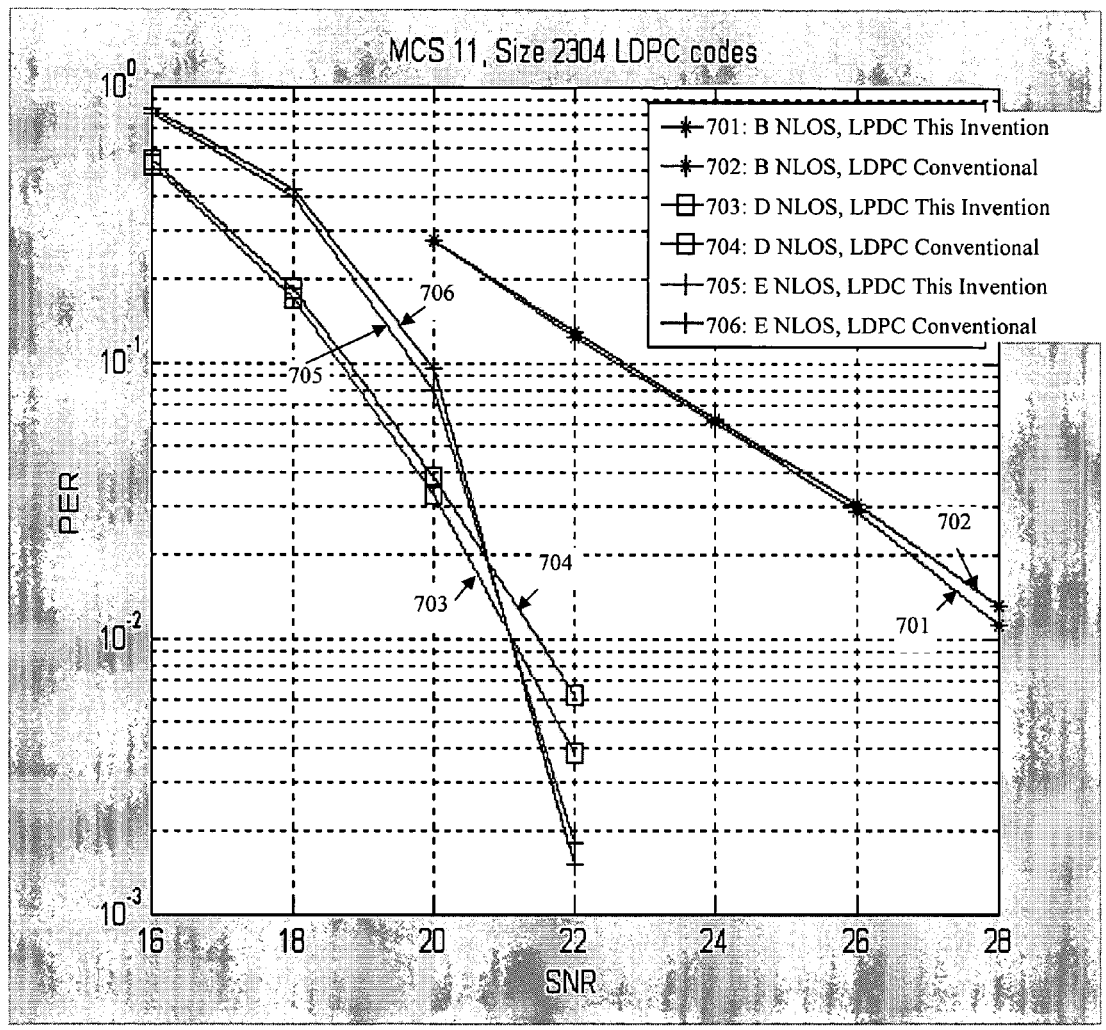
FIG. 14 shows example performance comparison of 1/2 code with 16QAM according to the present invention over 2×2×20 MHz 802.11n system of prior art.

FIG. 14 shows MCS 11, size 2304 LDPC, Channel B, D and E, NLOS comparative performance for codes designed according to an embodiment of the present invention and a conventional design according to the legends in the figure, wherein:

Curve 701 represents B NLOS, LDPC according to an example of the present invention.
Curve 702 represents B NLOS, LDPC conventional.
Curve 703 represents D NLOS, LDPC according to an example of the present invention.
Curve 704 represents D NLOS, LDPC conventional.
Curve 705 represents E NLOS, LDPC according to an example of the present invention.
Curve 706 represents E NLOS, LDPC conventional.

Figure 15:
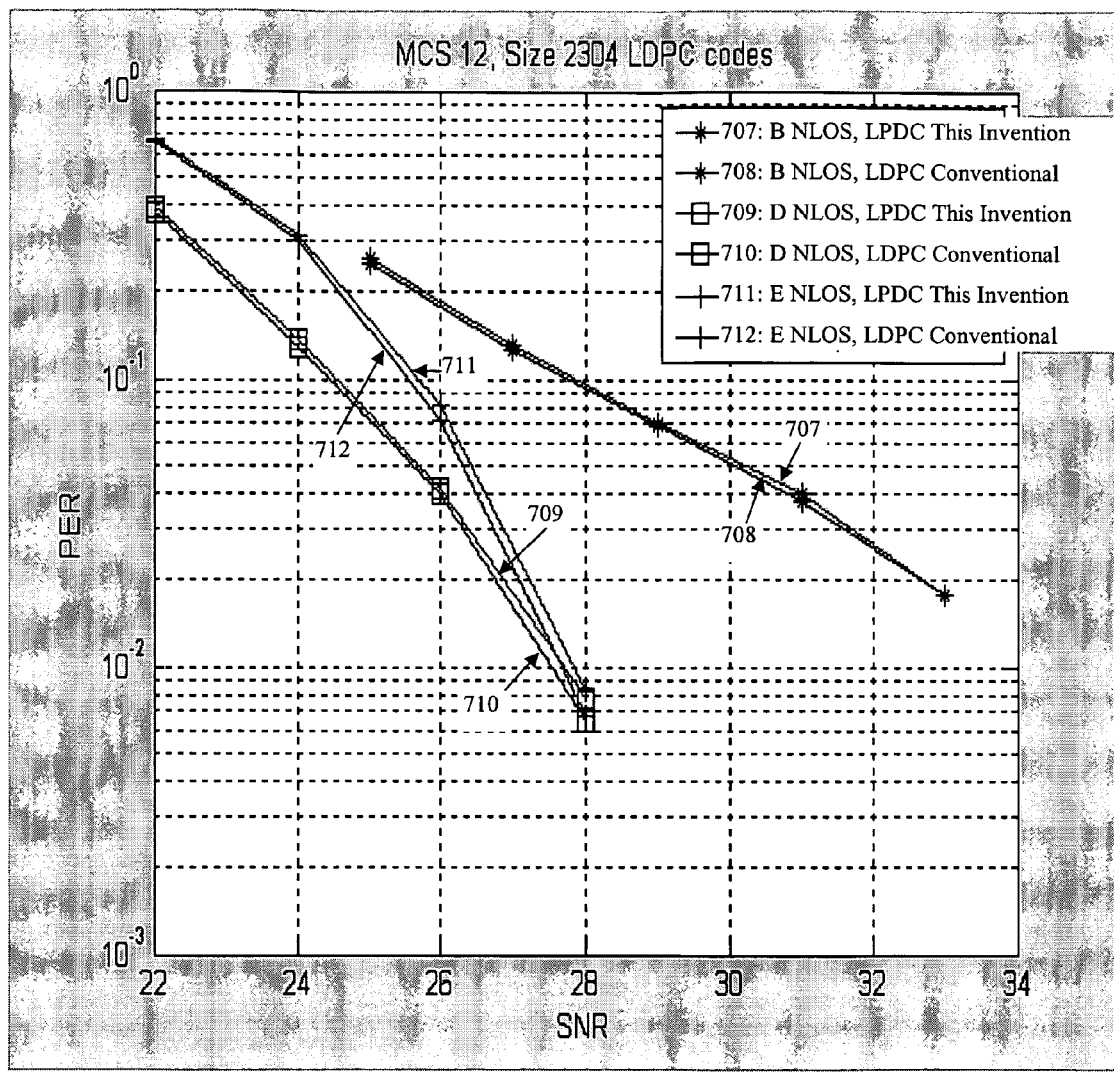
FIG. 15 shows example performance comparison of 3/4 code with 16QAM according to the present invention over 2×2×20 MHz 802.11n system of prior art.

FIG. 15 shows MCS 12, size 2304 LDPC, Channel B, D and E, NLOS comparative performance for codes designed according to an embodiment of the present invention and a conventional design according to the legends in the figure, wherein:

Curve 707 represents B NLOS, LDPC according to an example of the present invention.
Curve 708 represents B NLOS, LDPC conventional.
Curve 709 represents D NLOS, LDPC according to an example of the present invention.
Curve 710 represents D NLOS, LDPC conventional.

Curve 711 represents E NLOS, LDPC according to an example of the present invention.

Curve 712 represents E NLOS, LDPC conventional.

Figure 16:
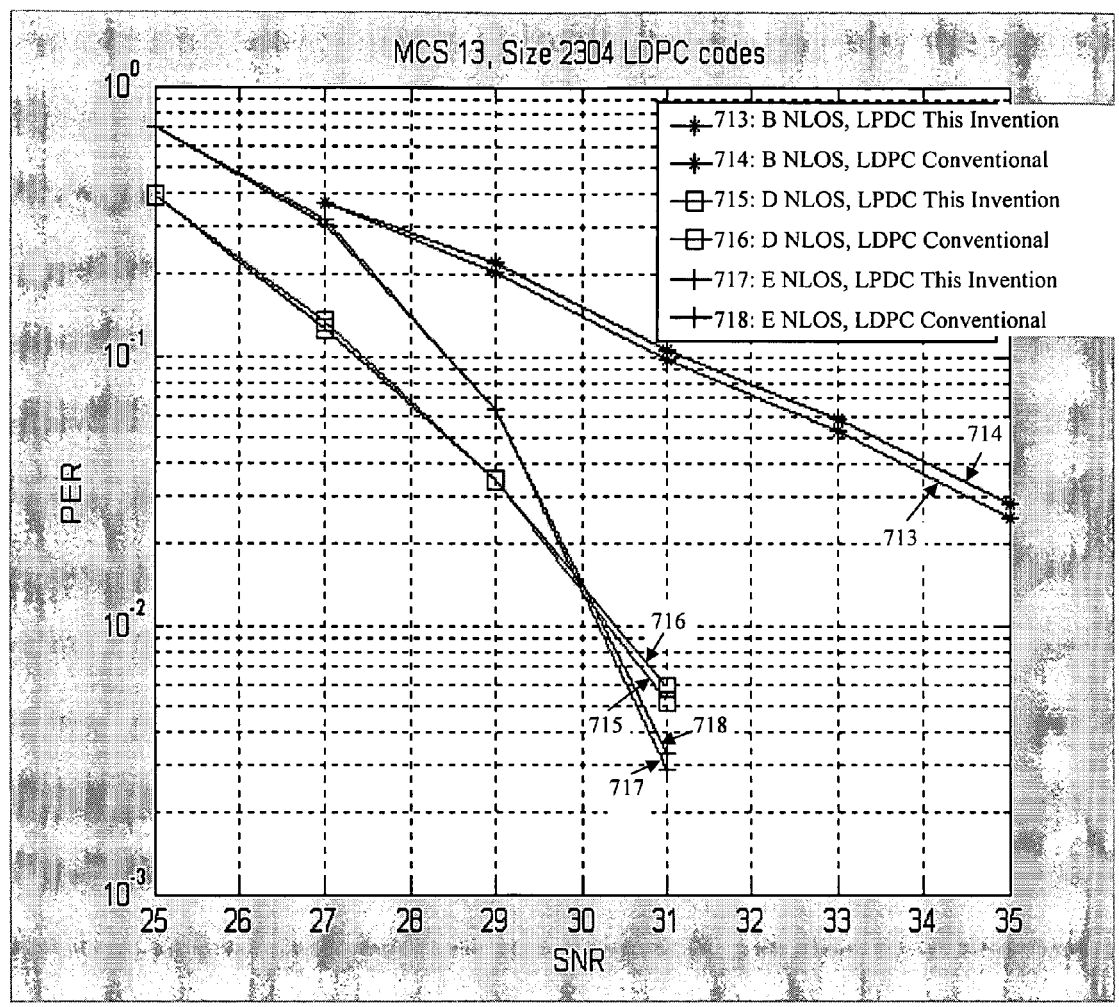
FIG. 16 shows example performance comparison of 2/3 code with 64QAM according to the present invention over 2×2×20 MHz 802.11n system of prior art.

FIG. 16 shows MCS 13, size 2304 LDPC, Channel B, D and E, NLOS comparative performance for codes designed according to an embodiment of the present invention and a conventional design according to the legends in the figure, wherein:

Curve 7013 represents B NLOS, LDPC according to an example of the present invention.

Curve 714 represents B NLOS, LDPC conventional.

Curve 715 represents D NLOS, LDPC according to an example of the present invention.

Curve 716 represents D NLOS, LDPC conventional.

Curve 717 represents E NLOS, LDPC according to an example of the present invention.

Curve 718 represents E NLOS, LDPC conventional.

Figure 17:
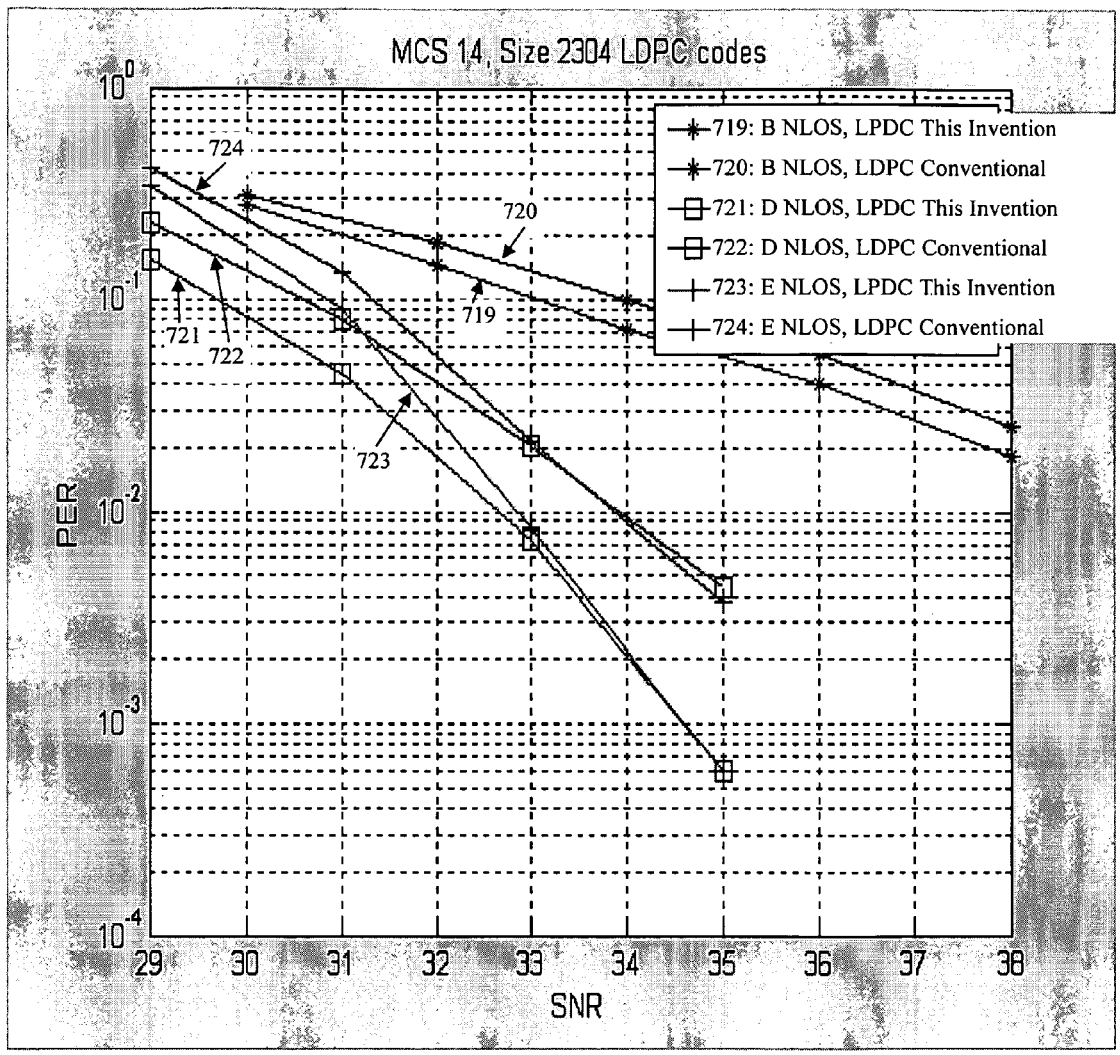
FIG. 17 shows example performance comparison of 3/4 code with 64QAM according to the present invention over 2×2×20 MHz 802.11n system of prior art.

FIG. 17 shows MCS 14, size 2304 LDPC, Channel B, D and E, NLOS comparative performance for codes designed according to an embodiment of the present invention and a conventional design according to the legends in the figure, wherein:

Curve 719 represents B NLOS, LDPC according to an example of the present invention.

Curve 720 represents B NLOS, LDPC conventional.

Curve 721 represents D NLOS, LDPC according to an example of the present invention.

Curve 722 represents D NLOS, LDPC conventional.

Curve 723 represents E NLOS, LDPC according to an example of the present invention.

Curve 724 represents E NLOS, LDPC conventional.

The code according to the present invention provides higher diversity order and lower decoding complexity.

Figure 1:
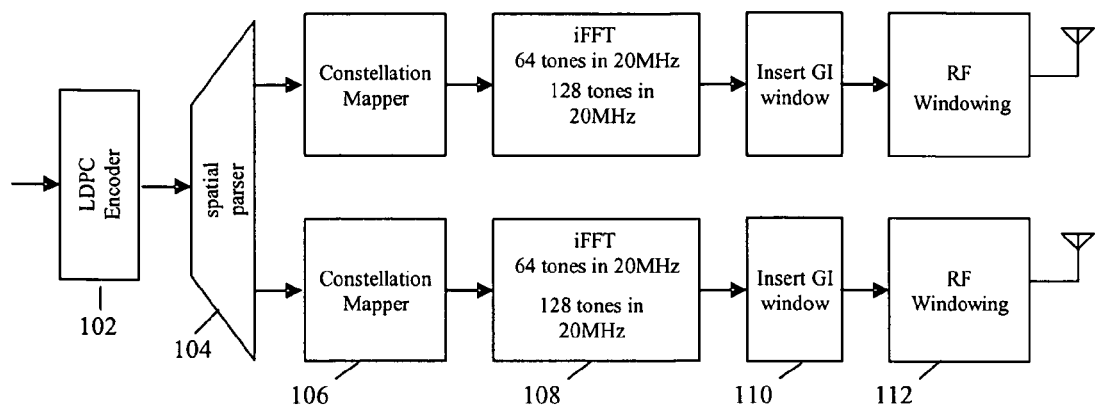
FIG. 1 shows an example conventional 802.11n MIMO transmitter with an LDPC encoder.

The present invention can be implemented in a transmitter such as the transmitter 100 in FIG. 1, and provides several improvements, including:

Systematic design of improved code ensembles using density evolution which provides the best tradeoff between decoding threshold and the decoding complexity;

Higher diversity order for MIMO systems with better built-in interleaving capability;

Code dimension tailored to 802.11n system parameters such as number of sub-carriers and delay;

Good girth control scheme;

Flexible length with different expanding factor;

Supporting easy encoding; and

Supporting shortening for multiple rates.

The codes generated according to the present invention can be implemented, for example, in a MIMO transmitter encoder such as encoder 102 in FIG. 1. As such, the present invention contemplates MIMO systems including an LDPC encoder in a transmitter and a LDPC decoder in a receiver, according to the present invention.

The present invention has been described in considerable detail with reference to certain preferred versions thereof; however, other versions are possible. Therefore, the spirit and scope of the appended claims should not be limited to the description of the preferred versions contained herein.

What is claimed is:

1. A method comprising:
   encoding data using Low Density Parity Check (LDPC) code by an encoder device, wherein encoding data includes
      determining column and row code weight distribution for an LDPC code matrix including a plurality of LDPC coded data, wherein the code weight distribution of the LDPC code matrix is determined based on applying a density evolution technique with Gaussian approximation to the LDPC coded data, where the LDPC code matrix includes rows of check nodes and columns of bit nodes;
      for a selected diversity order, determining average row weight and a maximum column weight of the LDPC code matrix;
      determining a decoding threshold based on the determined average row weight and maximum column weight; and
      adjusting the LDPC coded data based on the determined decoding threshold.

2. The method of claim 1, wherein the LDPC code matrix includes irregular LDPC codes.

3. The method of claim 1, wherein the LDPC code matrix has a first half and a second half, the first half having a same dimension as the second half.

4. The method of claim 1, wherein the LDPC code matrix is adjusted to have the first half arranged as dual-diagonal, and the second half of the LDPC code matrix is adjusted using a progressive edge growing (PEG) technique, wherein diversity order is provided for interleaving capability based on the adjusted LDPC code matrix.

5. The method of claim 4, wherein the first half of the LDPC code matrix arranged as dual-diagonal is a parity portion of the LDPC code matrix.

6. The method of claim 4, wherein the PEG technique maximizes girth of the LDPC code matrix while maintaining the column and row code weight distribution by eliminating particular cycles in a length histogram.

7. The method of claim 6, further comprising:
   counting cycles and eliminating the particular cycles by adjusting the LDPC code matrix to form an expanding matrix that is based on the LDPC code matrix and an expanding factor.

8. The method of claim 7, wherein the expanding matrix is formed to avoid cycles in a code tree graph.

9. The method of claim 1, further comprising:
   determining row M and column N dimensions for the LDPC code matrix based on a Number of sub-carriers per Orthogonal Frequency Division Multiplexing (OFDM) symbol in the data, number of data streams, and constellation size, where M and N are positive integers.

10. The method of claim 9, wherein the decoding threshold is determined based on the determined average row weight for a predetermined code rate R, where R is a positive real number.

11. The method of claim 10, wherein the code rate R is determined by the equation $R=M/N$.

12. The method of claim 1, further comprising:
   representing memory size required in a system as the average row weight determined from the LDPC code matrix; and
   representing a limit for arithmetic precision and processing requirements as the average column weight determined from the LDPC code matrix.

13. The method of claim 12 further comprising:
   adjusting LDPC code weight distribution in the LDPC code matrix to reduce the average row weight to reduce the memory size required in the system while maintaining an average column weight to remain within the limit for arithmetic precision and processing requirements.

14. The method of claim 13 further comprising:
   adjusting the LDPC code matrix by permuting the columns; and performing code shortening on the LDPC coded data in the LDPC code matrix.

15. The method of claim 14, wherein the columns of the LDPC code matrix are permuted such that after code shortening, the code row and column weights are evenly distributed.

16. A MIMO communication system comprising:
a transmitter including a Low Density Parity Check (LDPC) encoder that encodes data using LDPC codes, wherein the encoder is configured for determining column and row code weight distribution for an LDPC code matrix including a plurality of LDPC coded data, wherein the code weight distribution of the LDPC code matrix is determined based on applying a density evolution technique with Gaussian approximation to the LDPC coded data, where the LDPC code matrix includes rows of check nodes and columns of bit nodes;
the encoder is further configured for determining average row weight and a maximum column weight of the LDPC code matrix for a selected diversity order, determining a decoding threshold based on the determined average row weight and maximum column weight, and adjusting the LDPC coded data based on the determined decoding threshold.

17. The system of claim 16, wherein the LDPC code matrix includes irregular LDPC codes.

18. The system of claim 16, wherein LDPC code matrix has a first half and a second half, the first half having a same dimension as the second half.

19. The system of claim 18, wherein the encoder is further configured for adjusting the LDPC code matrix to have the first half arranged as dual-diagonal, and adjusting the second half of the LDPC code matrix using a progressive edge growing (PEG) technique, wherein diversity order is provided for interleaving capability based on the adjusted LDPC code matrix.

20. The system of claim 16 further comprising:
a receiver including a decoder, the decoder is configured for decoding data encoded with the LDPC codes.

* * * * *